Figure 1:
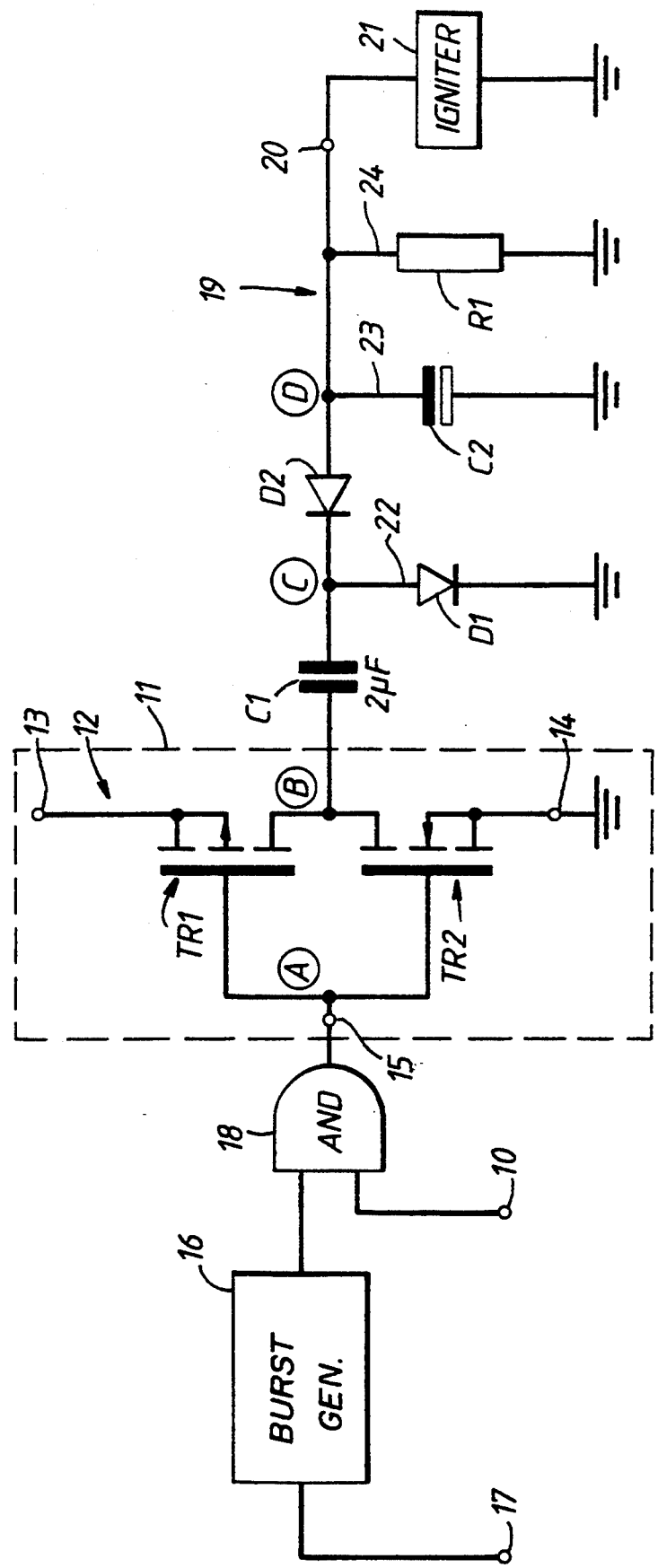

United States Patent [19]
McIlroy

[11] Patent Number: 5,447,103
[45] Date of Patent: Sep. 5, 1995

[54] CONTROL SIGNAL TRANSMISSION CIRCUIT

[75] Inventor: James W. McIlroy, Belfast, United Kingdom

[73] Assignee: Short Brothers PLC, Belfast, United Kingdom

[21] Appl. No.: 159,215

[22] Filed: Nov. 30, 1993

[30] Foreign Application Priority Data

Nov. 30, 1992 [GB] United Kingdom ............... 9225013

[51] Int. Cl.$^6$ ............................................. F42C 15/00
[52] U.S. Cl. .................................. 102/206; 102/202.1
[58] Field of Search ............ 102/206, 215, 218, 202.1, 102/426; 361/248, 249

[56] References Cited

U.S. PATENT DOCUMENTS

| | | | |
|---|---|---|---|
| H1068 | 7/1992 | Huhmann | 102/218 |
| 3,780,653 | 12/1973 | Stinchcomb | 102/218 |

OTHER PUBLICATIONS

Mano, Digital Logic and Computer Design, 1979, 584–586.

*Primary Examiner*—Daniel T. Pihulic

[57] ABSTRACT

A control signal transmission circuit for transmitting a control signal to a controllable device (21) to control the controllable device (21) and to protect the controllable device (21) against control by component failure generated signals. The circuit comprises a signal generating circuit (11) to generate in an output path (19) an amplitude varying signal, a DC blocking device (C1) in the signal output path (19) between an output terminal (20) to which the controllable device (21) is connected and the signal generating circuit (11) to prevent continuous flow of direct current therethrough while permitting the transmission of the amplitude varying signal, a first rectifying device (D2) in the output path (19) between the blocking device (C1) and the output terminal (20) and a second rectifying device (D1) connected in an intermediate path (22) between a point in the output path (19) between the blocking device (C1) and the first rectifying device (D2) and a terminal at a predetermined bias potential, the polarities of the rectifying devices (D1, D2) being such that first portions of the amplitude varying signal having potentials offset from the bias potential in one sense are conducted by the first rectifying device (D2) to the output terminal (20) for application to the controllable device (21) while second portions of the amplitude varying signal having potentials offset from the bias potential in the opposite sense are conducted by the second rectifying device (D1). The circuit meets safety requirements which demand that the probability of an unsafe condition in the circuit giving rise to inappropriate control of certain controllable devices be lower than 1 in $10^6$.

16 Claims, 2 Drawing Sheets

CONTROL SIGNAL TRANSMISSION CIRCUIT

The present invention relates to a control signal transmission circuit for transmitting a control signal to a controllable device which is to be controlled by the control signal and which is to be protected against control by component failure generated signals and is particularly although not exclusively concerned with a signal transmission circuit for the safe transmission of an activating signal to an igniter of a potentially explosive or explosive material such as, for example, the propellant of a rocket motor of a missile or the warhead of a missile.

Safety regulations based for example on ordnance board recommendations normally require two series connected "air break" switches, which would normally take the form of mechanical or electro-mechanical switches, between the electrical power source and the igniter. Such "air break" switches are controlled by sensors or other control devices which assure that safe conditions have been achieved before permitting the transmission of an electrical activating signal to the igniter.

The use of electronic sensors and other control devices to sense, for example, missile launch acceleration and to provide timing and control logic is now relatively common, although these electronic devices have been used only in association with the series connected "air break" switches.

The use of electronic devices in place of the "air break" switches invariably meets resistance from those responsible for the safety regulations due to their lack of confidence in the ability of the electronic devices to maintain a safe condition in the event of component failure. A criterion normally accepted as meeting a safe condition is that the probability of an unsafe condition occuring as a result of component failure should be lower than 1 in $10^6$.

It is an object of the present invention to provide a control signal transmission circuit by which the above criterion can adequately be met, but which does not rely on the provision of mechanical or electro-mechanical "air break" switches.

According to the present invention, there is provided a control signal transmission circuit for transmitting a control signal to an output terminal for connection to a controllable device to be controlled by the control signal comprising a signal generating circuit responsive to an input signal applied thereto to generate in a signal output path an amplitude varying signal, a DC blocking device included in the signal output path which prevents continuous flow of direct current therethrough while permitting the transmission therethrough of the amplitude varying signal, a first rectifying device included in the output path between the blocking device and the output terminal and a second rectifying device connected in an intermediate path between a point in the output path between the blocking device and the first rectifying device and a terminal at a predetermined bias potential, the polarities of the first and second rectifying devices being such that the first rectifying device conducts first portions of the amplitude varying signal having potentials offset from the bias potential in one sense for application to the output terminal while blocking conduction therethrough of second portions of the amplitude varying signal having potentials offset from the bias potential in the opposite sense and the second rectifying device conducts the second portions of the amplitude varying signal while blocking conduction therethrough of the first portions of the amplitude varying signal.

It will be appreciated that the control signal transmission circuit according to the present invention provides for the transmission of only those portions of the amplitude varying signal having potentials offset from the bias potential in the said one sense in response to the application of an input signal to the signal generating circuit and that transmission of component failure generated signals could only occur in a multiple fault situation arising from (i) a short circuit of the DC blocking device, (ii) a short circuit of the first rectifying device and (iii) an open circuit of the second rectifying device. With an appropriate choice of components for the DC blocking device and the two rectifying devices, the probability of such a multiple component failure condition occuring is calculated to be significantly lower than 1 in $10^6$.

In an embodiment of the invention hereinafter to be described, the signal generating circuit is such that in the absence of an input signal the signal output path at the input to the DC blocking device is maintained at the bias potential or at a potential offset from the bias potential in the said opposite sense. The signal transmission circuit as a whole is thus made intrinsically safe in the absence of an input signal to the signal generating circuit and thereby reduces still further the probability of a component failure generated signal appearing at the output terminal in the absence of an input signal.

In an embodiment of the invention hereinafter to be described, the signal generating circuit comprises a DC power supply circuit which provides a DC path between a first DC supply terminal maintained at a predetermined first potential and a second DC supply terminal maintained at a predetermined second potential and which includes switching means responsive to the input signal to produce in the signal output path to the DC blocking device a undirectional amplitude varying signal the amplitude of which varies between the first potential and the second potential.

In an embodiment of the invention hereinafter to be described, the signal output path is connected at its end remote from the output terminal to a point in the DC path intermediate the first DC supply terminal and the second DC supply terminal, the switching means comprises a first switching device which includes a DC path the opening and closing of which is controlled by the input signal which is applied to an input terminal to the device and which is connected in series in the section of the DC path between the output path and one of the first and second DC supply terminals and a second switching device which includes a DC path the opening and closing of which is controlled by the input signal which is applied to an input terminal to the device and which is connected in series in the section of the DC path between the signal output path and the other of the first and second DC supply terminals, and the switching devices are so chosen or so connected in the signal generating circuit that the DC path of each is open when the DC path of the other is closed and that together they produce in the signal output path to the DC blocking device a undirectional amplitude varying signal the amplitude of which varies between the first potential and the second potential.

In an embodiment of the invention hereinafter to be described, an input signal generating circuit generates the input signal and includes a burst generator providing an input signal in the form of a single burst of predetermined duration of a carrier of predetermined frequency.

In an embodiment of the invention hereinafter to be described, the switching devices are complementary junction transistor devices and the input signal generating circuit provides a single input signal to the two devices. Preferably, the junction transistor devices are insulated gate field effect transistors.

In an embodiment of the invention hereinafter to be described, the device to be controlled is a device activatable only in response to a control signal supplying activating energy to the device above a predetermined activating energy level and the signal generating circuit is such as to produce in response to the input signal an amplitude varying signal of such duration as to provide at the output terminal activating energy above the predetermined activating energy level.

In an embodiment of the invention hereinafter to be described, the amplitude varying signal generated in the output path to the DC blocking device is in the form of a control pulse of the amplitude varying signal of predetermined duration and the predetermined energy level is such that in the absence of a control pulse a failure in the signal generating circuit resulting in the transmission of a transient fault signal to the output terminal produces energy at a level below the predetermined activating energy level so that the device remains unactivated thereby.

In an embodiment of the invention hereinafter to be described, the DC blocking device is a charge storage device which charges during conduction of the second portions of the amplitude varying signal by the second rectifying device and which discharges during conduction of the first portions of the amplitude varying signal by the first rectifying device.

In an embodiment of the invention hereinafter to be described, a peak detector storage device is connected in a path between a point in the output path between the first rectifying device and the output terminal and a terminal at the predetermined bias potential to reduce the amplitude varying signal to a ripple variation at a predetermined amplitude level. A resistive component is then connected in a path between a point in the output path between the peak detector storage device and the output terminal and a terminal at bias potential to ensure that the peak detection storage device is in a discharged state prior to connection of the device to be controlled to the output terminal.

The bias potential may conveniently be ground potential, the predetermined potential at the second DC supply terminal also ground potential and the potential of the first DC supply terminal at a positive potential with respect to ground potential. The signal generating circuit may then be such as to produce in the signal output path to the DC blocking device an amplitude varying signal which varies between the positive potential of the first DC supply terminal and ground potential. The polarities of the first and second rectifying devices are then such that the first portion of the amplitude varying signal which is conducted by the first rectifying device is negative going with respect to ground potential.

Preferably, the signal generating circuit is such as to produce in the output path to the DC blocking device an amplitude varying signal of square wave form with a mark to space ratio of 1.1.

One embodiment of the invention will now be described by way of example with reference to the accompanying drawings in which:

FIG. 1 is a schematic circuit diagram of a signal transmission circuit for the transmission of an activating signal to an igniter of a solid propellant of a missile rocket motor, and FIGS. 2A to 2D are schematic representations of the waveforms of signals appearing at points A, B, C and D respectively in the circuit shown in FIG. 1.

Referring first to FIG. 1, a signal generating circuit 11 includes a DC power supply circuit providing a DC path 12 between a first DC supply terminal 13 maintained at a positive DC voltage (+10 V) with respect to ground potential (OV) and a second DC supply terminal 14 maintained at ground potential. The DC path 12 includes a p-channel enhancement mode insulated gate field effect transistor TR1 and an n-channel enhancement mode insulated gate field effect transistor TR2. The transistors TR1 and TR2 are connected as shown in the DC path 12 and are arranged to be controlled by an input signal applied at an input terminal 15 for application to the gate terminals of the two transistors TR1 and TR2. Each of the transistors TR1 and TR2 provides in the DC path a conducting channel between its source and drain when a signal of appropriate potential is applied to its gate terminal.

The input signal applied to the terminal 15 is in the form of a burst signal obtained from a burst generator 16 which includes a 650 KHz square wave form oscillator and which provides a single 55 ms burst of the carrier in response to an initiating signal applied to an input terminal 17. The burst signal from the generator is applied to the terminal 15 through an AND gate 18 which inhibits transmission of the burst signal until a signal indicative of all inhibit controls having been removed is applied to the AND gate 18 through an input terminal 10, thereby ensuring that the conditions are safe for ignition of the rocket motor to be controlled.

In the DC path 12 of the signal generating circuit 11 there is connected at point B between the transistors TR1 and TR2 a signal output path 19 to an output terminal 20 which is connected to a firing terminal of an igniter 21, the other terminal of the igniter 21 being maintained at ground potential.

The signal output path 19 includes a DC blocking device in the form of a capacitor C1 and a rectifying device in the form of a diode D2 which is, as shown, connected in the output path between the capacitor C1 and the output terminal 20. A further rectifying device in the form of a diode D1 is, as shown, connected in an intermediate path 22 between a point C in the output path 19 between the capacitor C1 and the diode D2 and a terminal at ground potential. In addition, a peak detector capacitor C2 is connected in a further intermediate path 23 between a point D in the output path 19 between the diode D2 and the output terminal 20 and a terminal at ground potential. Furthermore, a bleed resistor R1 is connected in a further intermediate path 24 between a point in the output path between the point D and the output terminal 20 and a terminal at ground potential.

In the operation of the circuit shown in FIG. 1, a carrier-frequency burst signal appears at input terminal 15 (point A) and is applied in parallel to the gates of the transistors TR1 and TR2. The burst signal appearing at point A is represented schematically by the waveform shown in FIG. 2A and comprises a 55 ms duration burst signal of a 650 KHz carrier having a 1:1 mark to space ratio and varying unidirectionally between ground potential (OV) and the positive potential (+10 v) of the DC supply.

Figure 2A:
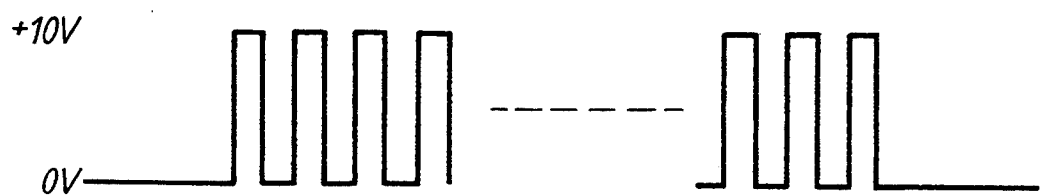
Figure 2B:
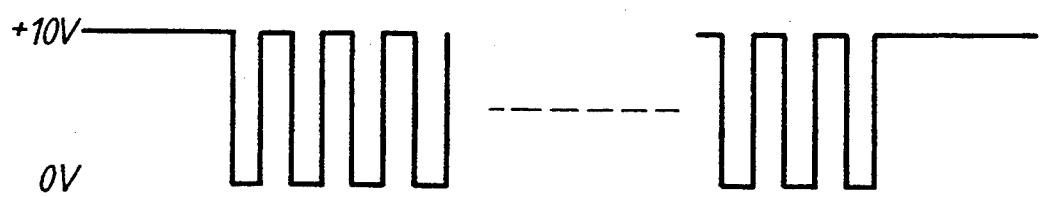
Figure 2C:
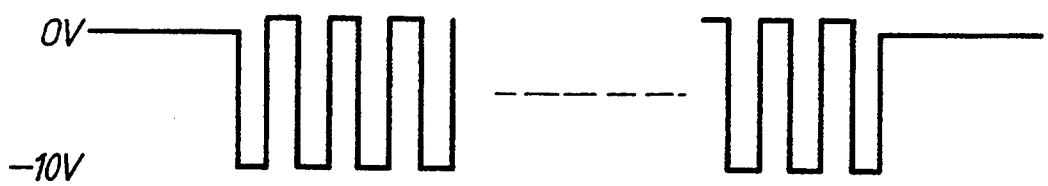
Figure 2D:
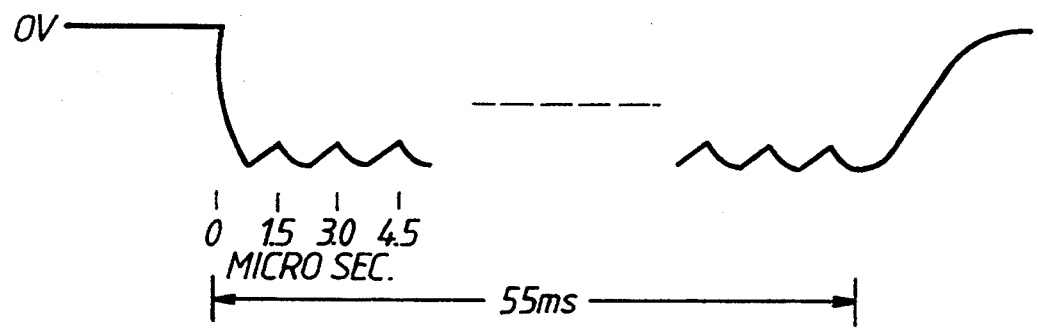

Application of the burst signal in parallel to the gates of the transistors TR1 and TR2 results in the alternate opening and closing of the channels of the two transistors in the following manner. Initially the signal appearing at the gates of the transistors TR1 and TR2 is low, that is to say, at a ground potential (OV) and in consequence the p-channel transistor TR1 is switched on and the n-channel transistor TR2 switched off. The capacitor C1 charges up through the diode D1 to the positive potential (10 v) of terminal 13. The burst signal at the gates of the transistors TR1 and TR2 then becomes positive going and during the positive half cycle of the carrier the p-channel transistor TR1 switches off and the n-channel transistor TR2 switches on, thereby bringing the input plate of capacitor C1 to the ground potential of terminal 14. There is thus produced at point B the waveform shown in FIG. 2B. As a consequence, the charge on the capacitor C1 is transferred to point C to produce a waveform as illustrated in FIG. 2C which is transmitted by the diode D2. The negative going burst signal transmitted by the diode D2 is modified by the peak detector storage capacitor C2 to produce a negative going signal at the point D as illustrated in FIG. 2D. It is applied to the igniter 21 and is arranged to have sufficient energy to fire the igniter 21.

The capacitor C2 acts solely as a peak detector aiding conversion efficiency and reducing the carrier frequency variation to a ripple for the 50 ms duration negative going pulse to be applied to the igniter 21. The resistor R1 is provided as a safety bleed which ensures that the capacitor C2 is discharged prior to connection of the igniter 21 to the terminal 20.

The minimum carrier frequency necessary for satisfactory operation of the circuit of FIG. 1 is governed by the energy/time required to fire the igniter 21 and by the energy "packet" transferred via capacitor C1 on each carrier cycle. This frequency is governed approximately by:

$$f = \frac{e}{t\, 0.5 C1\, V^2 K}$$

where
e = energy required to fire igniter 21
t = ignition time
V = voltage stored on capacitor C1
K = energy transfer efficiency factor However, in practice, within the operating speed limitations of the transistors TR1 and TR2 and the diodes D1 and D2, transfer efficiency improves as the frequency is increased. Above the minimum value, the frequency f is, in general, not critical and satisfactory operation over a decade, i.e. 100 KHz to 1 MHz, has been demonstrated.

A carrier waveform mark to space ratio of 1.1 is considered preferable for efficient energy transfer.

The circuit described with reference to FIG. 1 will function, at lower efficiency, without the capacitor C2. However, the higher level of carrier frequency current flowing in the cabling to the igniter 21 results in further losses and potential electromagnetic interference to other systems.

The value of capacitor C2 is governed by the carrier frequency and the igniter resistance. The higher the carrier frequency the lower the value of capacitor C2 required.

The signal transmission circuit described with reference to FIG. 1 adequately meets safety requirements which demand that the probability of an unsafe condition in the circuit giving rise to inappropriate ignition of the igniter 21 should be lower than 1 in $10^6$. The circuit is arguably safer than a "air break" switch which can be defeated by a single point defect, i.e., short circuit failure.

In particular, the circuit shown in FIG. 1 provides several safeguards to prevent ignition of the igniter 21 as a result of a failure of one or more circuit components.

As to the principal safeguard, the output terminal 20 of the circuit is protected from the transmission of DC voltages from the signal generating circuit 11 by provision of the capacitor C1 and the diodes D1 and D2.

Firstly, the circuit is intrinsically safe in the absence of a burst signal at the input terminal 15 as the only voltages available at the point B of the signal output path 19 will be positive with respect to ground potential and a short circuit failure of the capacitor C1 would by virtue of the diode D1 maintain point C at ground potential or marginally above ground potential and transmission would be blocked by diode D2. A short circuit failure of diode D1, in addition to a short circuit failure of the capacitor C1, would likewise not result in the transmission of an activating signal to the output terminal 20. Furthermore, a short circuit failure of the diode D2, in addition to the other failures, would do no more than allow transmission of a signal to the output terminal well below the activating energy level required to fire the igniter 21.

A DC path between the supply terminal 13 and the output terminal 20 which could give rise to ignition by the igniter 21 is only available in a multiple fault situation in which (i) the capacitor C1 is subject to a short circuit failure, (ii) the diode D1 is subject to open circuit failure and (iii) the diode D2 is subject to a short circuit failure. With an appropriate choice of components, the probability of a multiple fault condition of this magnitude can be made significantly lower than 1 in $10^6$.

Furthermore, by an appropriate choice of capacitance for the capacitor C1 the energy stored in it can be so chosen as to be below the "no fire" level of the igniter 21 so that the presence of a spurious pulse or a transient short circuit of the transistor TR2, prior to operation of the burst generator, although leading to a negative going pulse at point C in the signal output path 19 which would be transmitted by the diode D2 to the output terminal 20 would be insufficient to fire the igniter 21.

For example, a type E fuse head igniter has a "no fire" energy level of 2.3 mJ and with the capacitance of the capacitor C1 at 2 μF and a supply voltage of 10 volts the maximum energy stored in the capacitor C1 = 0.5 C1 Vs$^2$ = 0.1 mJ, safely below the energy level for the igniter of 2.3 mJ.

Although the configuration of the circuit shown in FIG. 1 is preferred, other component technologies may alternatively be employed. The insulated gate field effect transistors TR1 and TR2 may be replaced by bipolar junction transistors. Integrated circuit technology may be employed. A DC blocking transformer may be used in place of the capacitor C1. Such alternative circuit configurations would however maintain the inherent safety features conferred by:
 (a) conversion of the DC firing supply to an amplitude varying signal;
 (b) reconversion of the amplitude varying signal to a unidirectional signal with polarity inversion; and
 (c) multiple component failure needed to breach the barriers imposed by the circuit.

It will be appreciated that the signal transmission circuit according to the invention has wide application for the control of devices which need to be protected against component failure generated signals and although the embodiment of the invention hereinbefore specifically described with reference to the drawings is a signal transmission circuit for firing an igniter of a solid propellant of a missile rocket motor, it will be appreciated that the circuit will also find application in the control of other response critical devices and in the firing of other electrically initiated devices such as missile warheads.

I claim:

1. In combination, a controllable device for control by a control signal to be applied to a control terminal of the device and a control signal transmission circuit, comprising: a signal generating circuit and a signal output circuit wherein the signal output circuit has a signal output path between an input terminal of the signal output circuit and the control terminal of the device, wherein the signal output path provides the sole external electrical connection to the control terminal, wherein the signal generating circuit is responsive to an input signal applied thereto to generate an amplitude varying signal for application to the input terminal of the signal output circuit, wherein the signal output circuit comprises a DC blocking device included in the signal output path which prevents continuous flow of direct current therethrough while permitting the transmission therethrough of the amplitude varying signal, a first rectifying device included in the output path between the blocking device and the control terminal and a second rectifying device connected in an intermediate path between a point in the output path between the blocking device and the first rectifying device and a terminal at a predetermined bias potential, and wherein the polarities of the first and second rectifying device are such that the first rectifying device conducts first portions of the amplitude varying signal having potentials offset from the bias potential in one sense for application as the control signal to the control terminal while blocking conduction therethrough of second portions of the amplitude varying signal having potentials offset from the bias potential in the opposite sense and the second rectifying device conducts the second portions of the amplitude varying signal while blocking conduction therethrough of the first portions of the amplitude varying signal; whereby the signal output circuit while permitting the transmission of the control signal to the control terminal prevents the transmission of fault condition signals to the control terminal except in the event of multiple failures in the output circuit of the DC blocking device and the first and second rectifying devices.

2. The combination according to claim 1, wherein the signal generating circuit is such that in the absence of an input signal the input terminal of the signal output circuit is maintained at the bias potential or at a potential offset from the bias potential in the said opposite sense.

3. The combination according to claim 1, wherein the signal generating circuit comprises a DC power supply circuit providing a DC path between a first DC supply terminal maintained at a predetermined first potential and a second DC supply terminal maintained at a predetermined second potential and including switching means responsive to the input signal to produce at the input terminal of the output circuit a undirectional amplitude varying signal the amplitude of which varies between the first potential and the second potential.

4. The combination according to claim 3, wherein the input terminal of the signal output circuit is connected to a point in the DC path intermediate the first DC supply terminal and the second DC supply terminal, wherein the switching means comprises a first switching device which includes a DC path the opening and closing of which is controlled by the input signal which is applied to an input terminal to the first switching device and which is connected in series in the section of the DC path between the input terminal of the signal output circuit and one of the first and second DC supply terminals and a second switching device which includes a DC path the opening and closing of which is controlled by the input signal which is applied to an input terminal to the second switching device and which is connected in series in the section of the DC path between the input terminal of the signal output circuit and the other of the first and second DC supply terminals, and wherein the switching devices are so chosen or so connected in the signal generating circuit that the DC path of each is open when the DC path of the other is closed and that together they produce at the input terminal of the signal output circuit a undirectional amplitude varying signal the amplitude of which varies between the first potential and the second potential.

5. The combination according to claim 1, wherein an input signal generating circuit generates the input signal and includes a burst generator providing an input signal in the form of a single burst of predetermined duration of a carrier of predetermined frequency.

6. The combination according to claim 4, wherein the switching devices are complementary junction transistor devices and wherein the input signal generating circuit provides a single input signal to the two devices.

7. The combination according to claim 6, wherein the junction transistor devices are insulated gate field effect transistors.

8. The combination according to claim 1, wherein the controllable device is a device activatable only in response to a control signal supplying activating energy to the device above a predetermined activating energy level and wherein the signal generating circuit is such as to produce in response to the input signal an amplitude varying signal of such duration as to provide at the control terminal activating energy above the predetermined activating energy level.

9. The combination according to claim 8, wherein the amplitude varying signal generated at the input terminal of the signal output circuit is in the form of a control pulse of the amplitude varying signal which is of predetermined duration.

10. The combination according to claim 9, wherein the predetermined activating energy level is such that in the absence of a control pulse a failure in the signal generating circuit resulting in the transmission of a transient fault signal to the control terminal produces energy at a level below the predetermined activating energy level, whereby the device remains unactivated thereby.

11. The combination according to claim 1, wherein the DC blocking device is a charge storage device which is charged during conduction of the second portions of the amplitude varying signal by the second rectifying device and which discharges during conduction of the first portions of the amplitude varying signal by the first rectifying device.

12. The combination according to claim 1, including a peak detector storage device connected in a path between a point in the output path between the first rectifying device and the control terminal and a terminal at the predetermined bias potential to reduce the amplitude varying signal to a ripple variation at a predetermined amplitude level.

13. The combination according to claim 12, wherein a resistive component is connected in a path between a point in the output path between the peak detector storage device and the control terminal and a terminal at bias potential to ensure that the peak detection storage device is in a discharge state prior to connection of the control terminal of the controllable device to the signal output circuit.

14. The combination according to claim 3, wherein the bias potential is ground potential, wherein the predetermined potential at the second DC supply terminal is ground potential and wherein the potential of the first DC supply terminal is a positive potential with respect to ground potential and wherein the signal generating circuit is such as to produce at the input terminal of the signal output circuit an amplitude varying signal which varies between the positive potential of the first DC supply terminal and ground potential.

15. The combination according to claim 1, wherein the polarities of the first and second rectifying devices are such that the first portion of the amplitude varying signal conducted by the first rectifying device is negative going with respect to ground potential.

16. The combination according to claim 1, wherein the signal generating circuit is such as to produce at the input terminal of the signal output circuit an amplitude varying signal of square wave form with a mark to space ratio of 1.1.

* * * * *